United States Patent [19]
Navratil

[11] 4,008,420
[45] Feb. 15, 1977

[54] SWITCHABLE HIGH-FREQUENCY MAGNETIC ROTARY FIELDS

[75] Inventor: Franz Navratil, Munich, Germany

[73] Assignee: Siemens Aktiengesellschaft, Berlin & Munich, Germany

[22] Filed: July 21, 1975

[21] Appl. No.: 597,664

[30] Foreign Application Priority Data

July 22, 1974 Germany .......................... 2435245

[52] U.S. Cl. ................. 361/153; 361/156
[51] Int. Cl.[2] ....................................... H01H 47/00
[58] Field of Search ............. 317/DIG. 4, 123, 151

[56] References Cited
UNITED STATES PATENTS

| | | | |
|---|---|---|---|
| 3,163,804 | 12/1964 | Cox | 317/DIG. 4 |
| 3,682,144 | 8/1972 | Suda | 317/DIG. 4 |

*Primary Examiner*—Harry Moose
*Attorney, Agent, or Firm*—Hill, Gross, Simpson, Van Santen, Steadman, Chiara & Simpson

[57] ABSTRACT

An arrangement for the production of a magnetic rotary field with the help of a crossed coil pair of separate capacitance connected across each of said coils to form respective parallel resonant circuits each of which is in series with a timing circuit, a controllable voltage source and a resonant circuit switch. A timing pulse succession is fed into a program generator which supplies two 90° phase shifted groups of pulses respectively consisting of starting pulses, stopping pulses, and operational pulse successions. A first switching stage is controlled in each group by the starting and stopping pulses. The first switching stage is connected ahead of the resonant circuit in series with a controllable voltage source. The operational pulse succession controls a second switching stage which is parallel to the first switching stage and which is positioned in series with a controllable similarly poled voltage source whereby a direct voltage of opposite polarity is superimposed over the starting, stopping and operational pulses.

4 Claims, 3 Drawing Figures

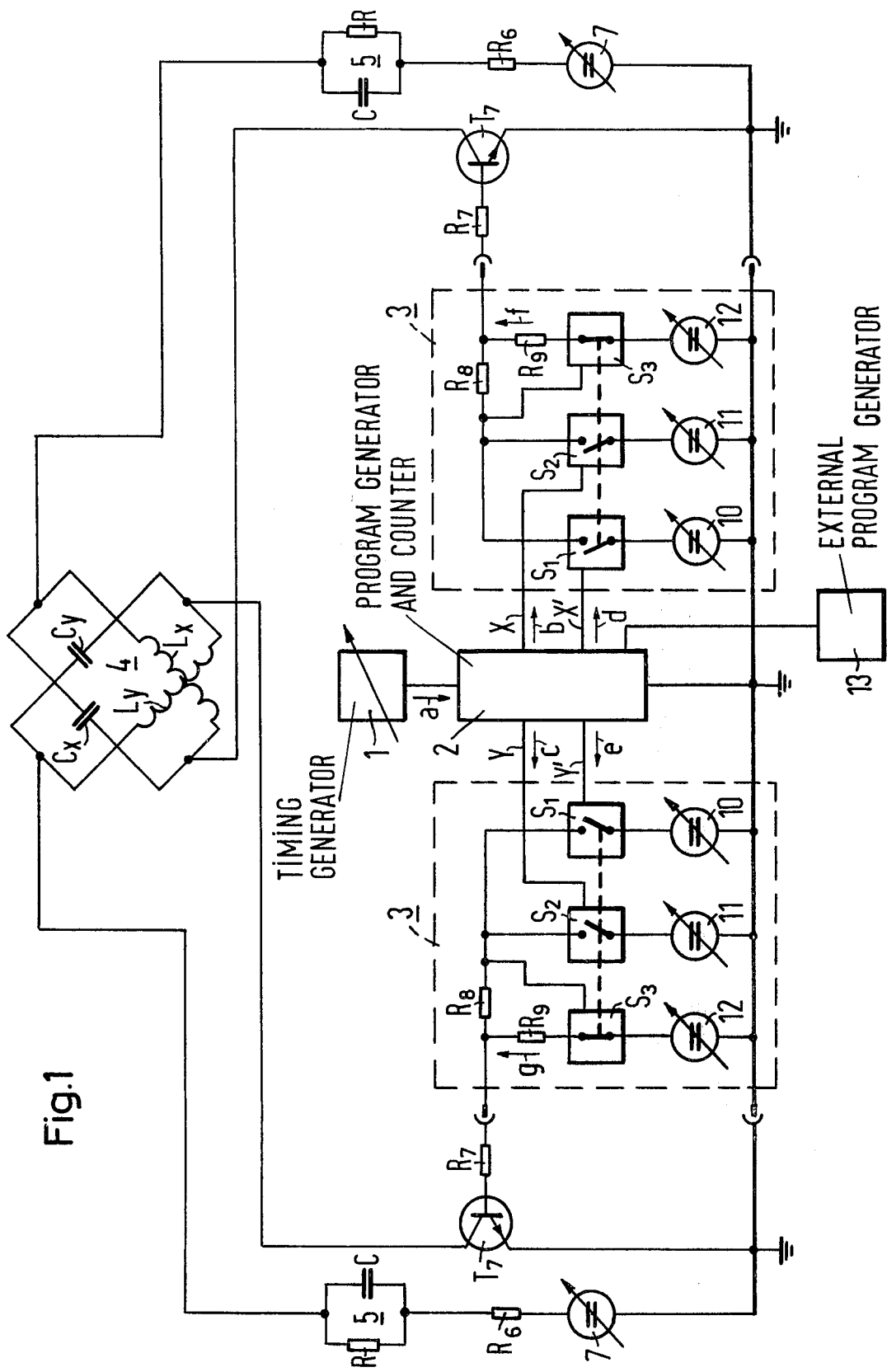

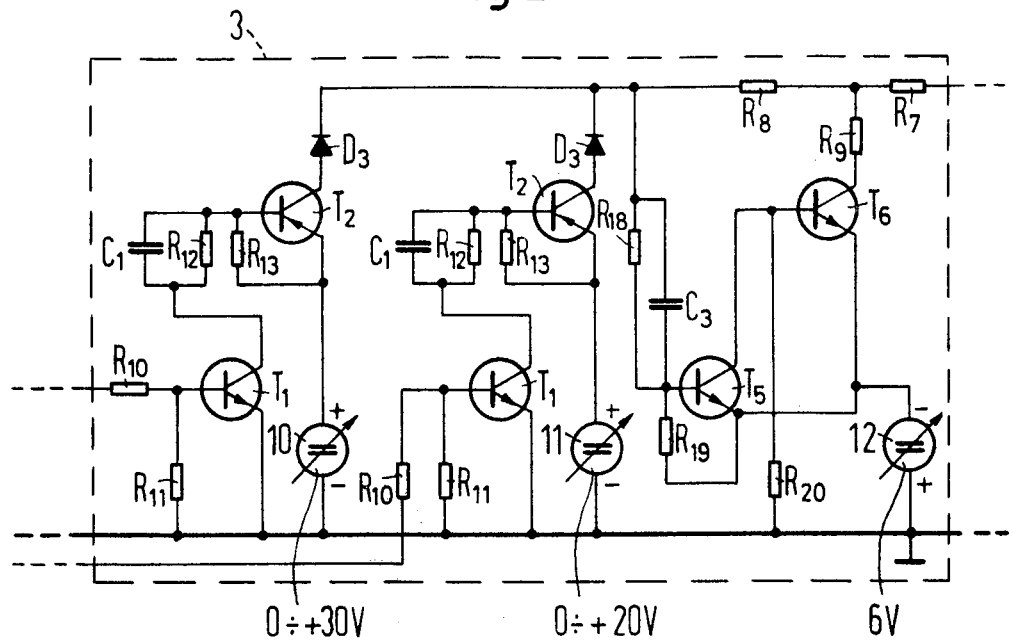
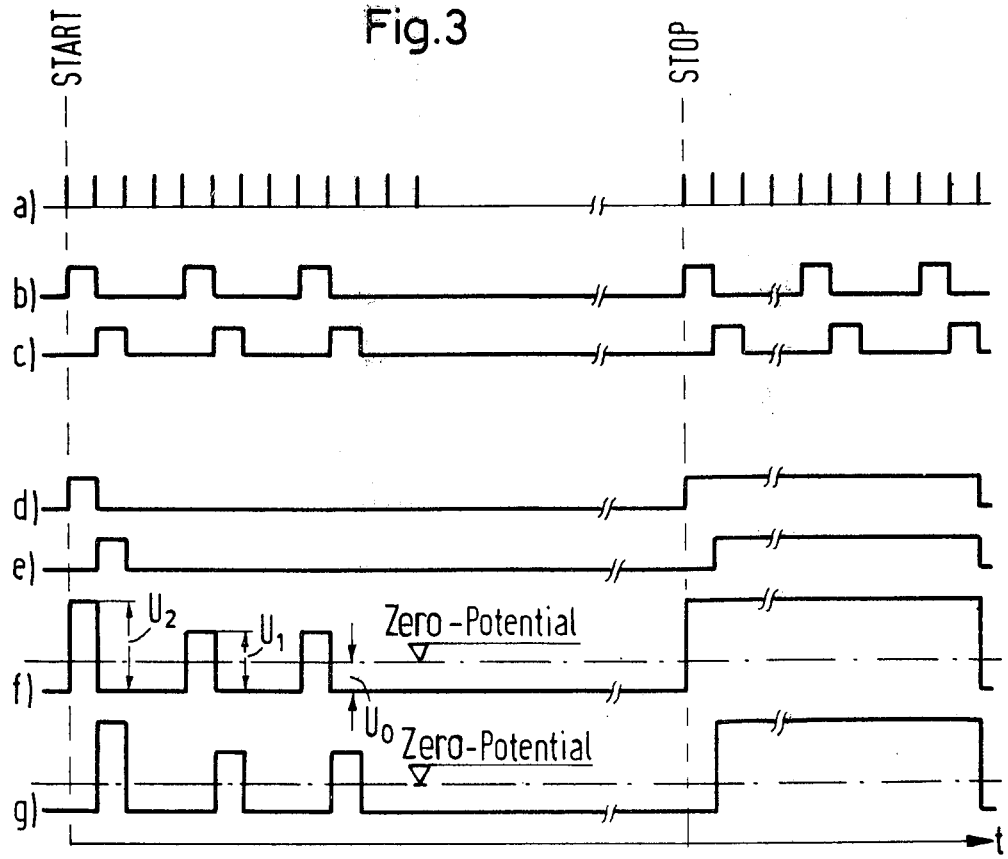

SWITCHABLE HIGH-FREQUENCY MAGNETIC ROTARY FIELDS

FIELD OF THE INVENTION

The field of art to which this invention pertains is high-frequency magnetic rotary fields and in particular to arrangements for switching such fields on and off to control the operation of cylinder-domain-transport memories.

SUMMARY OF THE INVENTION

It is an important feature of the present invention to provide an improved arrangement for producing high-frequency magnetic rotary fields for cylinder-domain-transport memories.

It is an object of the present invention to provide a switching arrangement to turn on and off high-frequency magnetic rotary fields to produce desired movement of cylinder-domains in a memory device.

It is also an object of the present invention to produce a switching arrangement as described above wherein a circuit is provided for feeding a succession of timing pulses to a program generator such that the program generator produces two 90° phase shifted groups of pulses which includes starting, stopping, and operational pulses and wherein these pulses are used to control switching arrangements for switching resonant circuits to produce the high-frequency magnetic rotary field.

It is also an object of the present invention to provide a switching arrangement as described above which includes a pair of switching stages coupled between the indicated resonant circuits and the program generator wherein the switching circuits are controlled by start and stop pulses produced by the program generator in response to the action of the timing generator.

These and other objects, features and advantages of the present invention will be understood in greater detail from the following description and the associated drawings wherein reference numerals are utilized to designate a preferred embodiment.

BRIEF DESCRIPTION OF THE DRAWINGS

FIG. 1 is a schematic circuit arrangement for the production of the starting and stopping pulses and the operational pulse succession of the present invention.

FIG. 2 shows the circuit portion illustrated by a dash-dotted line in FIG. 1.

FIG. 3 is a pulse succession diagram.

DESCRIPTION OF THE PREFERRED EMBODIMENT

This invention relates to a method for producing a high-frequency magnetic rotary field which can be switched on and off and which is useable in connection with cylinder-domain-transport memories.

Preferably, these memories comprise a layer-shaped storage medium (for instance, made of magnetic garnet or orthoferrite) having cylinder domains which are magnetized perpendicularly to the layer plane. The cylinder domains have a magnetizing direction opposite to the environment and to a magnetic bias field and have a manipulation pattern which is preferably periodic. The individual elements of the memory are placed onto one of the surfaces and are made of a magnetizeable material, in particular, a magnetostriction free NiFe alloy. The transport of the cylinder domain is brought about under the effect of a high-frequency magnetic rotary field having a field vector parallel to the layer plane.

The individual magnetic elements associated with manipulation patterns produce magnetic stray fields in this magnetic rotary field, and the cylinder domains move through these stray fields toward favorable energy positions at the individual elements. In the rotation of the magnetic rotary field in the layer plane, these energy minimums will disappear while new ones will be produced at other places in the manipulation pattern, and the cylinder domains will move towards these new ones. If the manipulation patterns have a suitable geometry, the cylinder domains will advance during a full rotation of the magnetic rotary field over one period of the manipulation pattern, i.e. over one storage place. Hence, the cylinder domains may be advanced along paths determined by the manipulation patterns in a steadily rotating magnetic field.

The magnetic field of rotation is produced in a crossed coil pair (Helmholtz coil pair) which may also be solenoids, whereas a separate capacitance is connected to each of said coils to form respective parallel resonant circuits for energy reasons which are triggered by 90° phase shifted pulses to produce sine or cosine currents. Special care is taken about the phase and amplitude of these control currents in order to guarantee an ideally rotating magnetic field in the operation space of the coil.

When the resonant circuits oscillate by switching on high-frequency generators which are coupled with the individual resonant circuits, the full energy and thus also the full magnetic fields strengths can only be reached after many oscillation periods, since the generators with their output impedance, which represents a limitation during the starting operation can supply the resonant circuits only with a finite amount of power. The conditions are similar when the generators are switched off, since the increase or decrease of current has an exponential curve which is not useable for a cylinder-domain-transport operation. For such an operation the full field amplitude is required when the generator is switched on so that all cylinder domains are transported simultaneously. Otherwise, the information will be distorted due to the change of the mutual phase relation of the individual cylinder domains, (individual cylinder domains are transported, but other cylinder domains are at first not transported towards the next storage place, since the critical threshold value of the field amplitude has not been exceeded). The same is valid in switching off the magnetic rotary field, wherein the amplitude of the field is required to be interrupted abruptly or at least brought below the critical level, such that cylinder domains are not transported.

It is thus required to have a magnetic rotary field which can be switched on and off within a quarter cycle. A generator serves this purpose which has a pair of crossed coils, each of which is supplemented by adding a capacitance to form a resonant circuit. This is a so-called Helmholtz coil pair where each resonant circuit is placed in series with a timing device namely an RC member, a controllable voltage source and a switch which is triggered by a control voltage respectively phase shifted over 90°.

The controllable voltage source is preferably applied to one terminal of the resonant circuit, by an RC-circuit, and the switch, which is preferably a PNP power switch transistor, is applied to the other terminal of the resonant circuit.

An object of the present invention is to provide a method of producing a control pulse as described above where control pulses refer to the starting and stopping pulses and the operational pulse successions having different heights and widths and which are respectively phase shifted by 90°.

In producing a high-frequency magnetic rotary fields with the help of a pair of crossed coils (Helmholtz coil pair) across each of which is connected in series a capacitance to form a resonant circuit, each resonant circuit is connected in series with a timing device, a controllable voltage source and a resonant circuit switch, each of the resonant circuit switches is triggered by fixed phase pulses and pulse successions phase-shifted by 90° with respect to one another. The invention provides that a timing pulse succession is fed into a program generator which supplies two groups of pulses phase-shifted by 90°, respectively, and consisting of starting pulses, stopping pulses, and operational pulse successions. A first switch stage of each resonant circuit switch is controlled by one group of starting and stopping pulses. This first switch stage is connected ahead of the resonant circuit and in series with a controllable voltage source. The operational pulse succession controls a second switching stage of each resonant circuit switch connected parallel to the first switching stage. Each second stage is in series with a controllable, similarly poled voltage source, and a direct voltage of opposite polarity is superimposed onto the starting, stopping and operational pulses.

A timing pulse succession, which can be regulated in its frequency, is advantageously fed into the program generator. This succession may be limited in its duration by way of a counter added to the program generator. The program generaor may possibly also be controlled by an external program of a further program generator which is connected to the input side of the indicated program generator. The magnetic rotary field generator is thus also applicable for measuring purposes.

The pulse widths of the pulses fed into the resonant circuits, (which pulses must always have the correct phase relation to one another within a wide frequency range such as between 10kHz and 1Mhz) are fixed in advance by the control function and have a fixed relation to the adjusted frequency. During the starting operation, the pulse duration of the starting and operational pulses is always a quarter period. During the switching-off, stopping pulses, with a pulse duration of several periods will be required. The arrangement of the switching stages connected between the resonant circuits and the program generator permit an independent control of the starting, stopping and operational pulses. The amplitude of the operational impulses is always selected in such a way as to compensate for energy losses due to damping in the resonant circuit. Due to direct voltages superimposed over the starting, stopping and operational pulses, which are often of opposite polarity, rapid removal of the charge carriers of the ionized base-emitter path of the power switching transistors commonly used as resonant circuit switches, will be obtained, and thus a magnetic rotary field of high frequency is made possible.

FIG. 1 shows a program generator and counter 2 fed with a timing pulse succession $a$ (FIG. 3a) through a timing generator 1 shown as a block diagram for simplicity. Via its outputs—X, X' and a switch 3, the program generator 2 is connected to the base of a switching transistor $T_7$ whose collector-emitter path is positioned between a terminal of a resonant circuit 4 and reference potential.

The resonant circuit 4 consists of the parallel combination of a capacitor $C_x$ and an inductance $L_x$, which may also be formed by a solenoid. The terminal of the resonant circuit 4 which is opposite to the transistor $T_7$ is connected with a controllable voltage source 7, through RC member 5 and resistor $R_6$. A circuit part which is shown on the left side of FIG. 1 is identical with this described circuit part and connected to further outputs Y, Y' of the program generator 2, whereby the inductivity $L_x$ of the one resonant circuit, whose capacitance is $C_x$ is combined with the inductivity $L_y$ of the other resonant circuit, to form a Helmholz coil pair.

Each switch 3 comprises three internal switching stages $S_1$, $S_2$, and $S_3$, shown in detail in FIG. 2. The switching stage $S_1$, which is positioned in series with a voltage source 10 and controllable between 0 and 30 volts, is controlled by the output side starting and stopping pulses $d$ and $e$ respectively of the program generator 2, which are shown in FIG. 3d and 3e respectively. Each switching stage $S_2$, which is in parallel with the switching stage $S_1$, is in series with a voltage source, 11, controllable between 0 and 20 volts, and is controlled by the pulse successions emitted at the X and Y output respectively of the program generator 2, which is shown in FIG. 3b and 3c respectively. The switching stage $S_3$ is in series with a constant direct voltage source 12, which is oppositely poled with respect to the direct voltage sources 10 and 11. The source 12 has a value of −6V in the illustrated embodiment.

The starting and stopping pulses and the operational pulse successions emitted at the X and X' and Y and Y' outputs respectively are phase-shifted by 90° with respect to each other.

During operation, the program generator 2 is triggered by a spiked pulse succession $a$ (FIG. 3a) produced by the controllable timing generator 1. The spiked pulse succession of the timing generator 1 has four times the frequency of the operation pulses shown in FIGS. 3b and 3c which control the switching stages $S_2$; this quadruple frequency is required for the conversion of the spiked pulses into two 90° phase-shifted rectangular pulse successions. The start and stop of the rotary field generator is effected by the start or stopping pulses, respectively, shown phase-shifted in FIGS. 3d and 3e, whereby these starting or stopping pulses are conducted towards the bases of the transistors $T_7$ by way of the switching stages $S_1$ and amplified in accordance with the adjusted voltage values of the direct voltage sources 10 and the resistors R8 and R7. The program generator 2 is embodied in such a way that one individual starting pulse is respectively emitted at the X' or Y' outputs, and that a stopping pulse, lasting several periods, is emitted at the output after switching off. The operational pulses emitted at the X and Y outputs of the program generator 2, parallel to the starting and stopping pulses, will trigger the subsequently connected switching stages $S_2$. Thus, the potentials $U_1$ adjusted at the voltage sources 11 in consideration of the damping losses in the resonant circuits 4 are applied to the bases of the transistors $T_7$ in the frequency of the operational pulse successions. Due to the constant direct voltage source 12 of each switch 3, a direct voltage $U_0$ of opposite polarity is superimposed over the starting, stopping and operation pulses (FIGS. 3f and 3g) which being particularly required for the production of high-frequency rotary fields, causes rapid extraction of the charge carriers of the base-emitter path of the transistors $T_7$ which path is ionized by the starting, stopping and operational pulses.

The first switching stage $S_1$ of each switch 3 consists of an NPN switching transistor $T_1$ whose collector is connected to the base of a PNP switching transistor $T_2$ via a time member $C_1$, $R_{12}$. The base of the switching transistor $T_1$ is connected to the $X'$ output of the program generator 2 by a resistor $R_{10}$ and to reference potential through a resistor $R_{11}$. The emitter of this transistor is also connected to reference potential. The base-emitter path of the transistor $T_2$ is in parallel with a resistance $R_{13}$. The voltage source 10 is positioned in the emitter branch of the switching transistor $T_2$ and its potential is $U_2$.

The switching stage $S_2$ of each switch 3, with the exception of the controllable voltage source 11 which can only be controlled between 0 and 20 volts, is identical with the switching stage $S_1$ and the same reference numerals have been selected for the electric component elements related thereto. The switching stages $S_1$ and $S_2$ are decoupled by diodes $D_3$ in such a way that interfering influences of coincidence pulses between the switching stages $S_1$ and $S_2$ will not occur.

Each switching stage $S_3$ comprises two NPN transistors $T_5$ and $T_6$ having emitters connected to the negative pole of the direct voltage source 12 and through a resistor $R_{19}$ and a time constant circuit ($R_{18}$–$C_3$) and a diode $D_3$ to the collectors of the switching transistors $T_2$ of the switching stage $S_1$ and $S_2$. The collector of the switching transistor $T_5$ is connected to the base of the switching transistor $T_6$ and its collector is coupled to the connection point between the resistors $R_7$ and $R_8$ through a resistor $R_9$. The base of each switching transistor $T_6$ is coupled to reference potential by a resistor $R_{20}$.

In the state of rest (when starting, stopping and operational pulses are not present at the outputs of the program generator), the switching stages $S_1$ and $S_2$ are blocked. Due to the starting, stopping and operational pulses, the NPN $T_1$ switching transistors are "on" so that pulses with steep wave fronts reach the bases of the PNP switching transistors $T_2$, through the time circuit $R_{12}$–$C_1$ and trigger the switching transistors in such a way that the amplitudes of the pulses are amplified corresponding to the values adjusted at the voltage sources 10 or 11, respectively. The resistors $R_{13}$ cause rapid extraction of the charge carriers of the base-emitter paths of the switching transistors $T_2$ in the time interval between the pulses, so that high-frequency pulses can be switched without interference.

In the case where the first two switching stages $S_1$ or $S_2$ of each switch 3 are on, respectively, the third switching stage $S_3$ of each switch 3 is blocked. Hence, pulses with steep wave fronts will reach the bases of the switching transistors $T_5$, through the RC members $R_{18}$–$C_3$, whereby the switching transistors are triggered and the direct-voltage sources 12 are switched off by the blocked switching transistors $T_6$.

In the case where starting, stopping or operational pulses are not present, the switching transistors $T_5$ are blocked and, accordingly, the switching transistors $T_6$ are on so that the connection points between the resistors $R_7$ and $R_8$ are coupled to the voltages $U_0$ of the voltage sources 12. The resistors $R_{20}$, togehter with the direct voltages determine the base currents for the transistors $T_6$.

The timing generator 1 and program generator and counter 2 are embodied in such a way that pulses or pulse successions, respectively of any desired duration can be produced, and the program generator 2 can be switched on and off externally and controlled by external programs supplied by an external program generator 14. For instance, when the generator is switched off by a monolithic flip flop stage, the program generator may be switched to the 0 position.

I claim as my invention:

1. An arrangement for producing a switchable high frequency magnetic rotary field, comprising:
    a pair of crossed coils; a separate capacitance connected across each of said coils to form respective parallel resonant circuits,
    each resonant circuit having in series therewith a timing device, a controllable voltage source and a resonant circuit switch,
    said resonant circuit switches being triggerable by fixed phase pulses and pulse successions which are displaced by 90° therewith, respectively, a program generator,
    means for feeding a timing pulse succession to said program generator, said program generator supplying starting and stopping pulses and operational pulse successions,
    each resonant circuit switch including first and second switching stages coupled in parallel with each other, the first switch stage being responsive to the starting and stopping pulses from the program generator,
    the second switch stage being responsive to the operation pulse succession from the program generator,
    controllable voltage sources of like polarity being connected in series with each of said first and second switching stages, and means for superimposing a direct voltage of opposite polarity onto the starting, stopping and operation pulses.

2. A circuit in accordance with claim 1 wherein the timing pulse succession fed to said program generator is controllable in frequency.

3. A circuit in accordance with claim 1 wherein a counting means is included in said program generator to limit the duration of the timing pulse succession.

4. A circuit in accordance with claim 1 wherein means are provided to control the operation of the program generator by means of an additional external program generator.

* * * * *